United States Patent [19]

Moore et al.

[11] Patent Number: 5,243,752
[45] Date of Patent: Sep. 14, 1993

[54] PROCESS OF MANUFACTURING AN INSTRUMENTATION APPARATUS WITH CURABLE INTERNAL MAGNETS

[75] Inventors: Stephen M. Moore, Fenton; Scott L. Semrau, Grand Blanc, both of Mich.

[73] Assignee: Delco Electronics Corporation, Kokomo, Ind.

[21] Appl. No.: 855,386

[22] Filed: Mar. 20, 1992

[51] Int. Cl.$^5$ .................... G01R 1/16; G01R 5/16; G01R 7/00; H01F 1/28
[52] U.S. Cl. .................... 29/606; 29/608; 148/101; 264/DIG. 58; 324/143; 324/146; 335/302
[58] Field of Search .............. 324/143, 146, 151 R, 324/151 A, 152, 154 R; 335/296, 299, 302; 29/602.1, 606–608; 148/101, 104; 252/62.51, 62.53, 62.54; 264/DIG. 58

[56] References Cited

U.S. PATENT DOCUMENTS

| | | | |
|---|---|---|---|
| 4,492,920 | 1/1985 | Reenstra | 324/146 |
| 4,724,601 | 2/1988 | MacManus et al. | 29/602 |
| 5,145,614 | 9/1992 | Kuroda | 148/101 X |

*Primary Examiner*—Gerard R. Strecker
*Attorney, Agent, or Firm*—Anthony Luke Simon

[57] ABSTRACT

An instrumentation apparatus with curable internal magnets is shown. The apparatus comprises a magnetic rotor and a rotatably mountable spindle to which the magnetic rotor is attached. A support structure to which the spindle is rotatably mounted defines at least one retaining area. A material is poured into and cured in the retaining area, and then charged to form a magnet. The molded and cured magnet provides a constant magnetic field that acts upon the magnetic rotor, providing a return-to-zero function or a volt gauge function for the instrumentation apparatus.

3 Claims, 2 Drawing Sheets

PROCESS OF MANUFACTURING AN INSTRUMENTATION APPARATUS WITH CURABLE INTERNAL MAGNETS

This invention relates to an instrumentation apparatus and a method or process of manufacturing the same device.

BACKGROUND OF THE INVENTION

In instrumentation devices such as the gauges commonly used in vehicle instrumentation panels, a pointer is rotated about an axis to indicate a measure of a parameter. In many applications of such devices, it is desirable that the pointer have a return-to-zero function. The return-to-zero function operates so that when power is not applied to the instrumentation device, the pointer returns to a zero or other nominal position. One common method for achieving the return-to-zero pointer function is to use a coil spring that provides a minimum torque, which returns the pointer to the zero position in the absence of a supervening signal. In another common method, one or more biasing magnets are placed proximate to a rotor of the apparatus. The biasing magnets provide a biasing magnetic field that, in the absence of a supervening signal, acts on the magnetic rotor to cause the rotor to turn until the pointer reaches the zero or nominal position. Both of these methods require additional parts in the apparatus in the form of either magnets or springs causing an increased price to obtain a gauge with a return-to-zero function.

An example prior art apparatus requiring biasing magnets is shown in FIG. 1. The apparatus shown includes a bobbin assembly 16 comprising upper bobbin 18 and lower bobbin 20. The bobbin assembly 16 defines a cavity in which rotor 32 is mounted on spindle 30 by bushing 31. The spindle 30 is rotatably mounted in bearings 34 and 36 in the bobbin assembly so that, as magnetic forces operate on rotor 32, it freely rotates, forcing rotation of spindle 30 to which pointer 38 is attached at the spindle end 40. Two coils, 26 and 28, are wound around the bobbin assembly 16 substantially perpendicular to each other and those coils are energized through leads 22, of which there are typically four (only two shown). The leads 22 are electrically connected to the coils 26 and 28 at connectors 24.

Within the cavity defined by bobbin assembly 16 where the rotor 32 is placed, a dampening fluid such as a silicone gel may be placed to dampen rotational movement of the rotor 32 and spindle 30. The instrumentation apparatus is typically placed in a low carbon steel can 46 such that the end 40 of spindle 30 is at the open end 48 of the can 46. Can 46 operates to block stray magnetic fields from operating on the rotor 32.

To provide a return-to-zero function for the instrumentation apparatus shown, two pre-formed magnets 14 are placed in retainers 12 and attached to the inside of can 46 proximate to coil 28 in the regions 42 and 44 indicated. The magnets 14 provide the magnetic field across the rotor 32 that tends to return the rotor 32, spindle 30 and pointer 38 to a nominal position, for example the zero position, when no magnetic fields caused by coils 26 and 28 are operating on the rotor 32.

In other implementations, the apparatus shown in FIG. 1 may be constructed with higher intensity magnets as magnets 14 so that the apparatus may be used as a volt gauge. When the apparatus is used as a volt gauge, the magnetic field created by the higher intensity magnets in combination with the field created by the coils 26 and 28 orients the rotor 32 to a position dependent upon the voltage across the coils 26 and 28.

SUMMARY OF THE PRESENT INVENTION

This invention provides an apparatus in which return-to-zero biasing magnets are formed in an extremely economical manner. Advantageously, this invention reduces both the size of the magnet required to generate the return-to-zero biasing magnetic field and the cost of implementing such magnets into the system.

Advantageously, this invention provides the discovery of a new method of manufacturing instrumentation devices. Advantageously, the process of this invention allows for efficient use of manufacturing resources. Advantageously, the process of this invention minimizes the number of parts required to provide a return-to-zero function in instrumentation devices. Advantageously, the process of this invention simplifies the manufacturing process for instrumentation devices with the return-to-zero function. Advantageously, the process of this invention minimizes the amount of magnetic material required to provide a return-to-zero function in instrumentation devices.

Advantageously, the process and apparatus of this invention provide a gauge apparatus with internal magnets with minimal position variance. Advantageously, this invention provides an improved volt gauge structure.

Structurally, the apparatus of this invention comprises a magnetic rotor mounted upon a spindle, the rotor rotating the spindle in response to magnetic fields applied to the rotor. A structural element for the instrumentation device defines at least one retaining area proximal to the magnetic rotor. A material is poured into and cured within the retaining area, to form a magnet.

Accordingly, the method or process of this invention comprises a first step of constructing a structural element defining a retaining area. In a second step, a flowable material capable of being cured and magnetized into a permanent magnet is added into the retaining area. In a third step, the material is cured, preferably so that it is no longer flowable. In a fourth step, the structural element is assembled into a spindle and rotor and, in a fifth step, a strong magnetic field is applied across the rotor and the material in the retaining area to thereby magnetize the rotor and the material in the retaining area to form permanent magnets.

A more detailed description of the apparatus and process of this invention is set forth below.

DETAILED DESCRIPTION OF THE INVENTION

Figure 2:
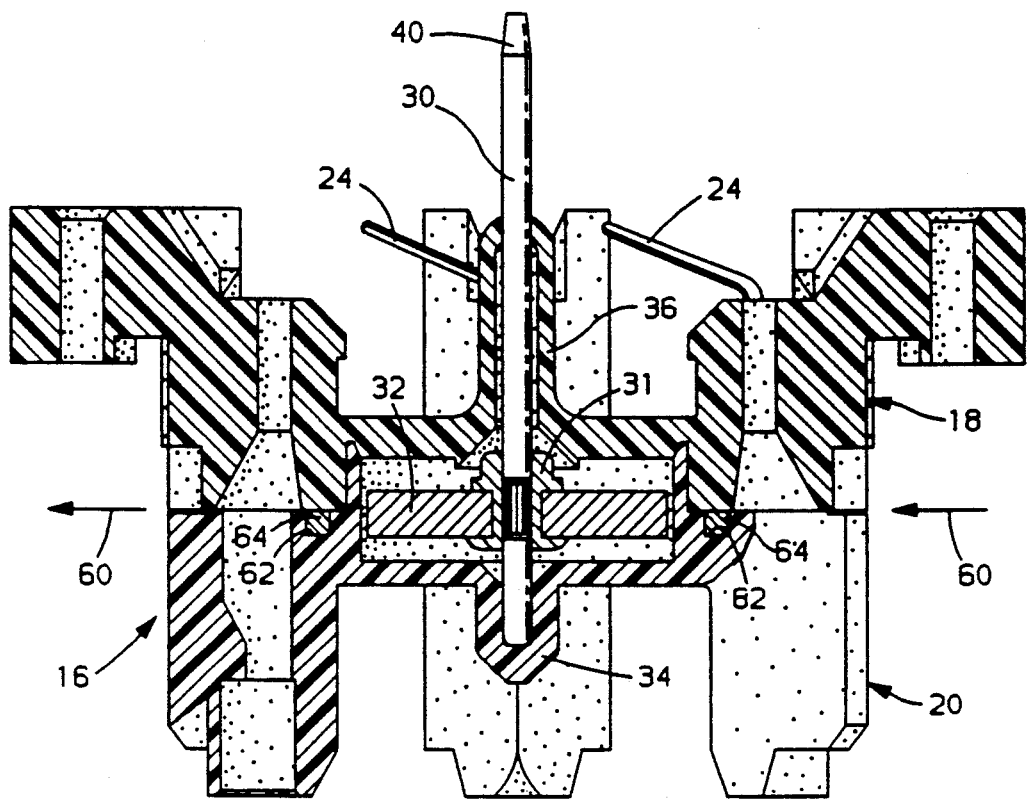
FIG. 2 is an illustration of the apparatus of this invention.

Referring to FIG. 2, the structural apparatus of this invention is shown. In the implementation shown, the lower bobbin 20 comprises a structural element of an instrumentation device and is molded from plastic. Lower bobbin 20 defines one or more retaining areas. 62 (two shown here), which, in the absence of material 64, define a cavity in conjunction with upper bobbin 18. In the implementation shown, the retaining areas 62 are diametrically opposed to each other with respect to the axis of spindle 30.

The material 64 includes (1) a fluid base such as a curable resin, and (2) a magnetizable dispersate, i.e., particles of magnetizable material dispersed in the fluid base. The material 64 is added to the retaining areas 62 while the material 64 is in a liquidous, flowable state. At this point, the apparatus comprises lower bobbin 20 and a liquidous material comprising the fluid base and the magnetizable dispersate within the retaining areas 62. The fluid base may comprise any known type of curable material such as a polymer curable by ultraviolet radiation, heat, microwave radiation, exposure to air or any other known type of curing method. The magnetizable dispersate within the curable material 64 may be any known type of magnetizable material such as Alnico TM powder.

After the material 64 is placed within the retaining area 62, it is cured into a substantially solid state by the process proper for the specific curable material used, e.g., many resins are cured by ultraviolet radiation. Many types of suitable material 64 for use with this apparatus are well known to those skilled in the art and no further detail regarding such materials need be given here.

After the material 64 is cured, the upper bobbin 18 is assembled to the lower bobbin 20 with the rotor 32 on spindle 30 properly in place. A strong magnetic field is then placed across assembly in the direction of the arrow 60 to magnetize the cured material 64 and the rotor 32. After this magnetizing process, the cured material 64 comprises permanent magnets that constantly provide a magnetic field across rotor 32 in the direction of arrow 60. In the absence of other forces acting on rotor 32, the constant magnetic field acts to rotate rotor 32 so that rotor 32 is realigned with the constant magnetic field. This position of alignment of the rotor 32 and the constant magnetic field is the zero or nominal position to which the pointer (38, FIG. 1) will always return.

Figure 1:
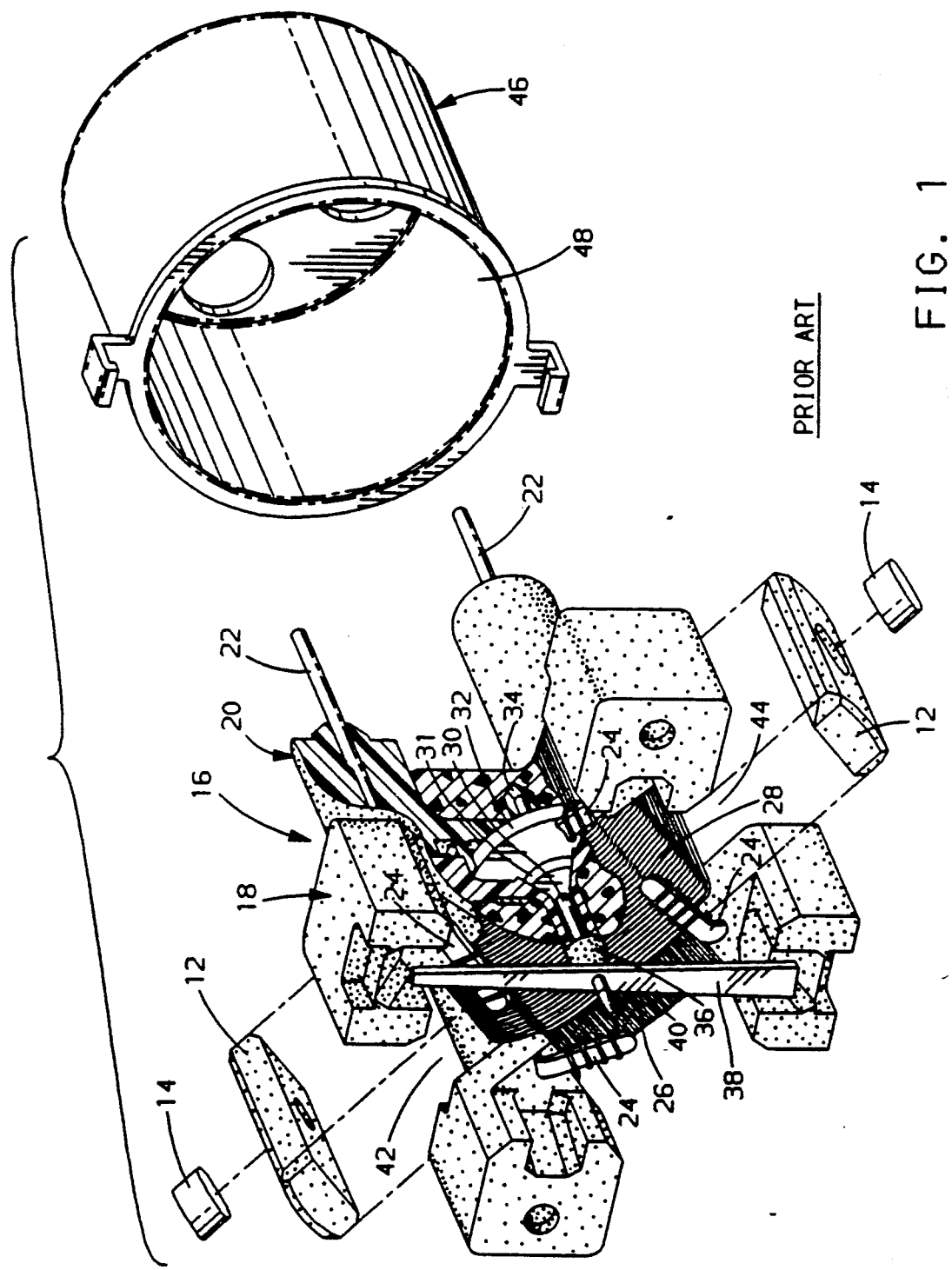
FIG. 1 is an illustration of a prior air core gauge with external biasing magnets.

The apparatus may then be completed with components similar to those shown in FIG. 1, including the first and second coils 26 and 28 wound around the bobbin assembly 16, terminal leads 22 soldered to the coils, can 46 and a pointer 38. Construction of the remaining elements of the instrumentation device is well known to those skilled in the art.

With reference to FIG. 2, one of the primary advances of this invention can be understood. It has been found that retaining areas of the size 2.5 mm in length, 2.0 mm in width and 2.0 mm in depth are sufficient. The magnets formed therein provide a magnetic field strong enough to return the pointer and rotor to the zero position. This is a significant advance over the prior art shown in FIG. 1, in which the button magnets 14 typically have a diameter of 7.0 mm and a depth of 2.0 mm. The drastically reduced size of the magnets required by this invention provides a reduction in the amount of magnetic material required, which in this example is 87 per cent. Of course the size of the magnets formed in the retaining areas and the retaining areas themselves will vary from implementation to implementation as system parameters dictate. In some instances larger retaining areas will be required and in some instances smaller retaining areas will be required.

Another advantage of this invention readily discernible at this point is the accurate placement of the magnets formed by the cured material 64. With the prior art insert magnets 14 shown in FIG. 1, the position of the magnets 14 in relation to the coils 26, 28 and the rotor 32 varied with the position of the retainers 12 in the can 46. According to this invention, however, the retaining areas 62 can be repeatably molded in a precise location in the structural element of the gauge, thereby providing precise location and minimal position variance of the cured magnets.

The above apparatus of this invention can be used in gauge implementations to provide functions other than the return-to-zero function. For example, in many volt gauges for vehicles, one or more permanent magnets are used to provide a higher intensity magnetic field on the rotor 32 than the return to zero strength field. The higher intensity magnetic field acts with the field created by at least one coil (26, FIG. 1) to rotate the rotor, indicating the voltage of the signal applied across the coil. The higher intensity magnetic field is provided by a magnetizable dispersate in the material 64 preferably comprising a rare earth type magnetic substance, such as Magnequench TM (a trademark owned by General Motors Corporation).

Figure 3:
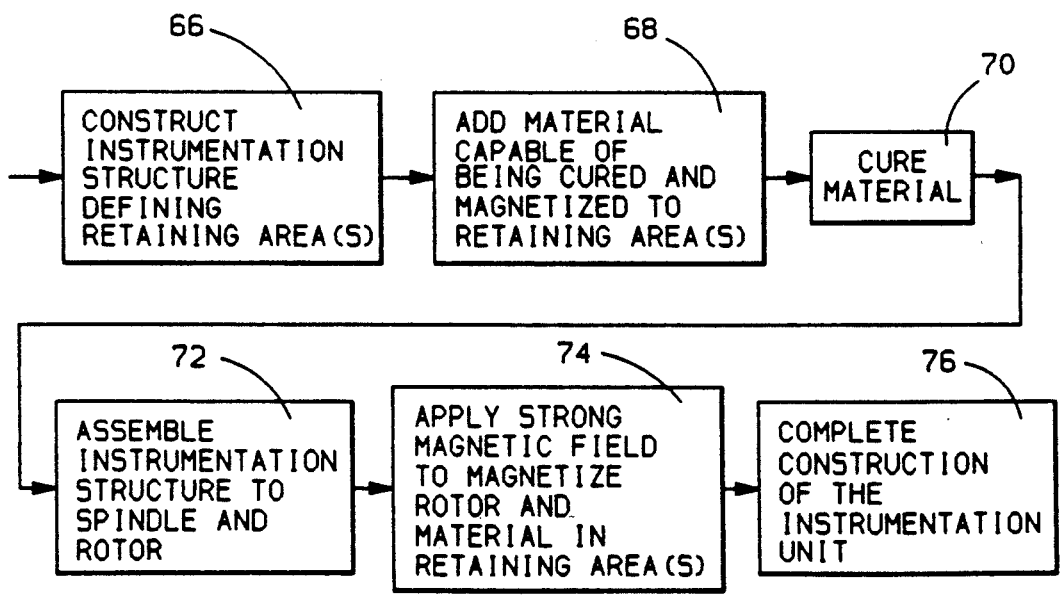
FIG. 3 is an illustration of the method of this invention.

Referring to FIG. 3, the process of manufacture of the apparatus of this invention is set forth. At step 66, a structural element such as lower bobbin 20 in FIG. 2, is constructed to define at least one retaining area, e.g., the structural element may be molded from plastic with retaining areas 62 molded therein. At step 68, a flowable material capable of being cured to a substantially rigid state and magnetized, e.g., material 64, is added to the retaining areas in the structural element, e.g., by pouring or dispensing the material into the retaining areas. At step 70, the material is cured into a substantially solid state by a suitable curing process, e.g., by ultraviolet radiation. At step 72 the spindle and rotor (30, 32) are assembled into the structure. In the case shown in FIG. 2, step 72 requires application of upper bobbin 18. At step 74, a strong magnetic field is applied across the assembly to magnetize the magnetizable material in the retaining areas and the rotor of the instrumentation unit.

The remainder of the instrumentation assembly is then completed (step 76) in a manner well known to those skilled in the art. In the case shown in FIG. 2, the completion of the assembly includes the winding of the coils, the attachment of the connectors and the insertion of the coils and bobbin into the can.

The above described method of manufacture is the preferred method. Variations on this method may include adding additional steps, adapting this method to varied structures, and performing the steps in a different order.

The above descriptions of this invention comprise the preferred embodiments and are set forth with respect to the preferred instrumentation unit. Other types of instrumentation units may be used with this invention. For example, the structural element may take a different form or shape than the bobbin shown above. The location and the number of windings may be varied. The can may be omitted in certain implementations. In general, various other improvements and modifications to this invention may occur to those skilled in the art and will meet the structure and spirit of this invention as set forth below.

The embodiments of the invention in which an exclusive property or privilege is claimed are defined as follows:

1. A process of manufacturing instrumentation devices comprising the steps of:

constructing a structural element of an instrumentation device, said structural element for performing at least one function of a set of functions comprising: (1) retaining a spindle of the instrumentation device and (2) supporting at least one coil wound around the structural element, wherein the structural element includes at least one cavity;

adding, to the cavity, a flowable material comprising a curable fluid base and a magnetizable dispersate;

curing the fluid base into a substantially solid state;

applying a strong magnetic field across the structural element to magnetize the magnetizable dispersate; and completing assembly of the instrumentation device.

2. The process of claim 1 also comprising the step of assembling a spindle and a rotor to the structural element.

3. The process of claim 2 wherein the step of applying the strong magnetic field to magnetize the cured material also magnetizes the rotor.

* * * * *